United States Patent
Amano

(10) Patent No.: US 6,850,113 B2
(45) Date of Patent: Feb. 1, 2005

(54) DEMODULATOR AND COMMUNICATION DEVICE USING THE SAME

(75) Inventor: Shinji Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 61 days.

(21) Appl. No.: 10/101,633

(22) Filed: Mar. 21, 2002

(65) Prior Publication Data

US 2002/0135418 A1 Sep. 26, 2002

(30) Foreign Application Priority Data

Mar. 21, 2001 (JP) ........................................ 2001-081522

(51) Int. Cl.[7] .............................................. H03D 3/00
(52) U.S. Cl. ...................... 329/315; 329/319; 375/324
(58) Field of Search ................... 329/300, 304, 329/306, 315, 318–321, 311–314; 375/224, 229, 230, 231, 233, 235, 324, 329, 330, 340

(56) References Cited

U.S. PATENT DOCUMENTS

| | | | | |
|---|---|---|---|---|
| 4,692,914 A | * | 9/1987 | Yasumura et al. | 369/47.18 |
| 5,161,004 A | * | 11/1992 | Egger | 348/555 |
| 5,926,065 A | * | 7/1999 | Wakai et al. | 329/304 |
| 6,166,594 A | * | 12/2000 | Nielsen et al. | 329/319 |
| 6,188,275 B1 | * | 2/2001 | Mattisson et al. | 329/311 |

FOREIGN PATENT DOCUMENTS

JP          07-115328          5/1995

* cited by examiner

*Primary Examiner*—Minh Nguyen
(74) *Attorney, Agent, or Firm*—Harness, Dickey & Pierce, P.L.C.

(57) ABSTRACT

A demodulator includes a reference signal generator for generating a reference signal, an FM demodulation circuit for demodulating a modulated signal, and a control circuit for controlling demodulation sensitivity of the FM demodulation circuit. The control circuit controls the demodulation sensitivity of the FM demodulation circuit so that an output signal, obtained when the reference signal from the reference signal generator is inputted to the FM demodulation circuit, becomes a specified value. This structure can stabilize the demodulation sensitivity of the demodulation circuit while restraining increases in circuit scale and current consumption, and can adjust dispersions in the demodulation sensitivities of the respective ICs due to relative errors of a resistance value of a resistor and a capacity value of a condenser in an IC, the resistor and the condenser constituting the demodulator.

55 Claims, 9 Drawing Sheets

DEMODULATOR AND COMMUNICATION DEVICE USING THE SAME

FIELD OF THE INVENTION

The present invention relates to a demodulator for demodulating a modulated signal, for example, a frequency modulated signal [FM (Frequency Modulation) signal], more particularly to a demodulator having a circuit for automatically adjusting demodulation sensitivity of a modulated signal, and a communication device provided with the demodulator.

BACKGROUND OF THE INVENTION

Generally, when using a demodulator demodulating a modulated signal, for example, a frequency modulated signal (hereinafter referred to as an FM signal), in a wireless communication device, an FM demodulation circuit and a filter circuit or a phase shifter are required. In addition, along with miniaturization of a device having a demodulator in recent years, such as a wireless communication device, the downsizing of the demodulator has been promoted.

As a means to downsize the demodulator, it can be considered to integrate an FM demodulation circuit and a filter circuit. However, when the FM demodulation circuit and the filter circuit are integrated in the demodulator, absolute accuracies of a resistance value of a register, a capacity value of a condenser, etc. in this integrated circuit (hereinafter referred to as an IC) are not satisfactory, causing a deviation in demodulation sensitivity and frequency characteristic for each IC.

This is because a frequency characteristic of the filter circuit or the phase shifter used in the demodulator demodulating the FM signal generally depends on a product CR, that is, the product of a capacity value (C) of a condenser and a resistance value (R) of a resistor which constitute the filter circuit or the phase shifter.

Conventionally, in order to eliminate such dispersions in the characteristics of the respective ICs, a circuit has been proposed in which the demodulation sensitivity of an FM demodulation circuit and the frequency characteristic of a filter circuit or a phase shifter in a demodulator are automatically adjusted by utilizing that relative accuracies of a resistance value of a resistor and a capacity value of a condenser are satisfactory compared with absolute accuracies of the same in an identical IC.

As a circuit for automatically adjusting the demodulation sensitivity and the frequency characteristic, for example, "an FM signal demodulation circuit" is disclosed in Japanese Unexamined Patent Publication No. 7-115328/1995 (Tokukaihei 7-115328, published on May 2, 1995). FIG. 14 schematically shows a demodulator having the FM signal demodulation circuit.

As shown in FIG. 14, the demodulator is structured so as to include an input terminal 101 to which an FM signal is inputted; an FM demodulation circuit 104 for demodulating the FM signal inputted to the input terminal 101, constituted by a phase shifter 108 and a phase comparator 109; an output terminal 106 for outputting the signal demodulated by the FM demodulation circuit 104; and a CTRL circuit 105 for controlling a characteristic of the phase shifter 108 included in the FM demodulation circuit 104 and outputting a control signal for stabilizing demodulation sensitivity.

Here, the CTRL circuit 105 is a circuit for generating the control signal for stabilizing the demodulation sensitivity, and is arranged so as to automatically adjust the demodulation sensitivity and the frequency characteristic in the FM demodulation circuit 104 by the generated control signal.

Meanwhile, the CTRL circuit 105 of the demodulator shown in FIG. 14 is a large-scale circuit, as it includes a reference circuit having a circuit structure in the same way as the phase shifter 108 and the FM demodulation circuit 104. This arrangement causes increases in circuit scale and current consumption of the demodulator as a whole. Besides, although a relative accuracy is satisfactory compared with an absolute accuracy in an identical IC, a dispersion occurs in the demodulation sensitivity of the FM demodulation circuit, due to relative errors in the resistance value of the resistor and the capacity value of the condenser inside the IC.

SUMMARY OF THE INVENTION

It is an object of the present invention to provide a demodulator which can stabilize the demodulation sensitivity of a demodulation circuit with restraining increases in circuit scale and current consumption, and adjust dispersions in the demodulation sensitivities of the respective ICs due to relative errors of a resistance value of a resistor and a capacity value of a condenser inside an IC, and to provide a communication device provided with the demodulator.

To achieve the foregoing object, a demodulator of the present invention is structured so as to include:

a demodulation circuit for demodulating a modulated signal; and a control circuit for controlling a characteristic of the demodulation circuit so that an output value of a demodulated signal obtained when a reference signal used for controlling the characteristic of the demodulation circuit is inputted to the demodulation circuit becomes a specified value.

Consequently, control on the characteristic of the demodulation circuit, for example, stabilization of demodulation sensitivity, is carried out based on the demodulated signal obtained when the reference signal is inputted to the demodulation circuit which is the subject of the control. Therefore, overall circuit scale of the demodulator can be reduced compared with a conventional case where the characteristic of the demodulation circuit is controlled by using the result in a circuit for characteristic control which is provided aside from the demodulation circuit, resulting in restraining a current consumed in the circuit.

In addition, to achieve the foregoing object, another demodulator of the present invention, which is a demodulator for demodulating a modulated signal whose frequency is modulated, is structured so as to include:

a demodulation circuit having a frequency characteristic changeable circuit for changing a frequency characteristic of an input signal; and a control circuit for controlling a frequency characteristic of the demodulation circuit so that an output value of a demodulated signal obtained when a reference signal used for controlling a characteristic of the demodulation circuit is inputted to the demodulation circuit becomes a specified value.

Therefore, since the demodulation circuit includes the frequency characteristic changeable circuit, the demodulation sensitivity is controlled by controlling the frequency characteristic. Thus, the control circuit is arranged so as to control the frequency characteristic of the demodulation circuit so that the output value of the demodulated signal obtained when the reference signal used for controlling the characteristic of the demodulation circuit is inputted to the demodulation circuit becomes the specified value.

Besides, the control on the characteristic of the demodulation circuit means control for stabilizing the modulation sensitivity, which is a characteristic of the demodulation circuit, at a constant level. Thus, it is sufficient to set the foregoing specified value at a value targeted for making the modulation sensitivity of the demodulation circuit at a constant level (a target value). In other words, it is sufficient to control the characteristic, that is, the frequency characteristic of the frequency characteristic changeable circuit of the demodulation circuit, so as to be at a constant level.

Consequently, the demodulation sensitivity can be stabilized by stabilizing the control on the frequency characteristic of the demodulation circuit based on the demodulated signal obtained when the reference signal is inputted to the demodulation circuit which is the subject of the control. Therefore, overall circuit scale of the demodulator can be reduced compared with a conventional case where the characteristic of the demodulation circuit is controlled by using the result in a circuit for characteristic control which is provided aside from the demodulation circuit, resulting in restraining a current consumed in the circuit.

The foregoing demodulator may be used in a signal receiving section of a communication device which receives/transmits a modulated signal.

In this case, demodulation sensitivity is automatically stabilized in the demodulator of the receiving section, and thus receiving accuracy and demodulation accuracy of the modulated signal can be improved.

For a fuller understanding of the nature and advantages of the invention, reference should be made to the ensuing detailed description taken in conjunction with the accompanying drawings.

DESCRIPTION OF THE PREFERRED EMBODIMENTS

[First Embodiment]

The following description will explain one embodiment of the present invention. Incidentally, in the present embodiment, explanation will be given on a demodulator which uses a frequency modulated signal (FM signal) as a modulated signal and demodulates the FM signal.

Figure 1:
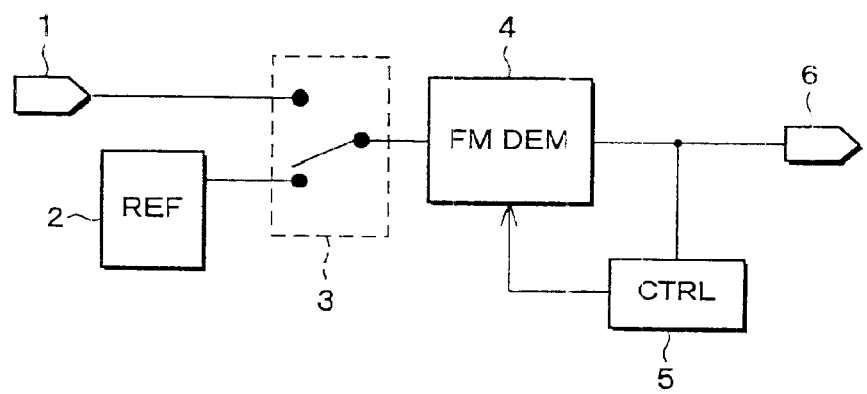
FIG. 1 is a block diagram showing a schematic structure of a demodulator in accordance with one embodiment of the present invention.

As shown in FIG. 1, the demodulator in accordance with the present embodiment is structured so as to include an input terminal 1 to which an FM signal is inputted; a reference signal generator (REF) 2 for generating a reference signal; an FM demodulation circuit (FM DEM) 4 for demodulating the inputted FM signal; a switch circuit 3 for switching between the FM signal from the input terminal 1 and the reference signal from the reference signal generator 2 to transmit either one of the signals to the FM demodulation circuit 4; an output terminal 6 for outputting a demodulated signal from the FM demodulation circuit 4; and a control circuit (CTRL) 5 for controlling a characteristic of the FM demodulation circuit 4 so that an output signal of the FM demodulation circuit 4 becomes a specified value.

The above-structured demodulator is supposed to be integrated and built into an integrated circuit (hereinafter referred to as an IC) together with other circuits, etc.

Figure 12:
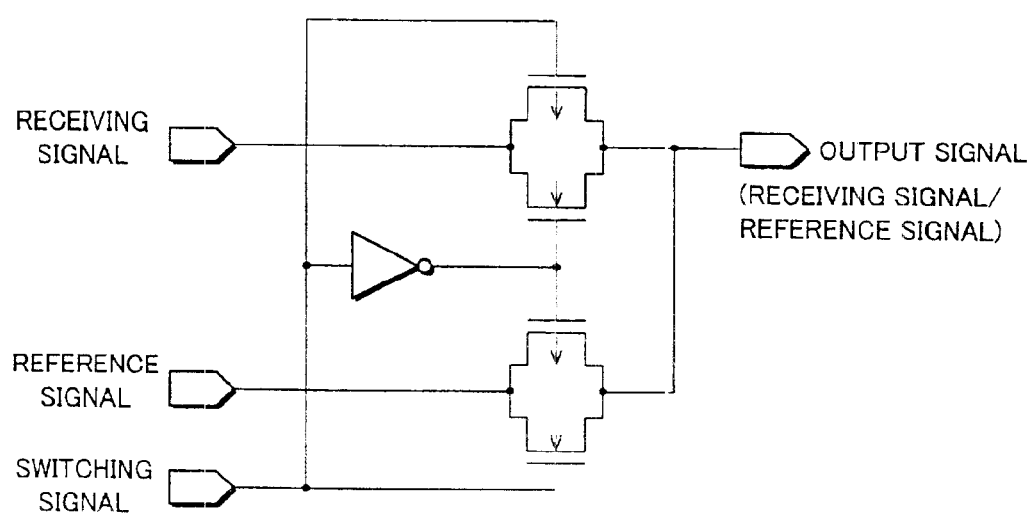
FIG. 12 is a block diagram showing a schematic structure of one example of a switch circuit used in the demodulator of the present invention.

As the switch circuit 3, a MOS-FET having a circuit, for example, such as that shown in FIG. 12 is used, and the switch circuit 3 is switched ON/OFF according to a signal from a logic circuit built in the IC (a switching signal). That is, when the switch circuit 3 is ON, a receiving signal is outputted as an output signal, and when the switch circuit 3 is OFF, the reference signal is outputted as an output signal.

Here, when controlling the characteristic of the FM demodulation circuit 4, the switch circuit 3 switches to the reference signal generator 2, the reference signal from the reference signal generator 2 is inputted to the FM demodulation circuit 4, and the output signal demodulated by the FM demodulation circuit 4 is inputted to the control circuit 5. The control circuit 5 generates a control signal for controlling the characteristic of the FM demodulation circuit 4 based on the output signal obtained by demodulating the reference signal by the FM demodulation circuit 4. Therefore, a sinusoidal signal having a constant frequency is used as the reference signal generated by the reference signal generator 2.

The control circuit 5 generates the control signal for controlling the characteristic of the FM demodulation circuit 4 so that a value obtained based on the output signal obtained by demodulating the reference signal by the FM demodulation circuit 4 (hereinafter, the output signal will be referred to as a reference output signal) becomes a predetermined specified value.

The control on the characteristic of the FM demodulation circuit 4 means control for stabilizing the modulation sensitivity, which is a characteristic of the FM demodulation circuit 4, at a constant level. Thus, it is sufficient to set the foregoing specified value at a value targeted for making the modulation sensitivity of the FM demodulation circuit 4 at a constant level (a target value). In other words, it is sufficient to control a characteristic, that is, a frequency characteristic, of frequency characteristic changeable means of the FM demodulation circuit 4 so as to be at a constant level.

When controlling the characteristic of the FM demodulation circuit 4, the control circuit 5 completes the control on the characteristic at the time when the value obtained based on the output signal from the FM demodulation circuit 4 becomes the specified value. Thereafter, the control circuit 5 controls so as to maintain a state in which the control on the characteristic of the FM demodulation circuit 4 has been completed, that is, a state in which the characteristic is in a specified state.

In addition, upon the completion of the control on the characteristic of the FM demodulation circuit 4, the switch circuit 3 switches from the reference signal generator 2 to the input terminal 1, the FM signal from the input terminal 1 is inputted to the FM demodulation circuit 4, and the demodulated signal is outputted from the FM demodulation circuit 4. The demodulated signal from the FM demodulation circuit 4 is supplied to the output terminal 6, and is also supplied to the control circuit 5. Here, the control circuit 5 generates the control signal for maintaining the state in which the control on the characteristic of the FM demodulation circuit 4 has been completed, based on the demodulated signal from the FM demodulation circuit 4, and supplies the control signal to the FM demodulation circuit 4.

In the demodulator having the foregoing structure, by switching the switch circuit 3 first so that the reference signal from the reference signal generator 2 is inputted to the FM demodulation circuit 4 so as to control the characteristic of the FM demodulation circuit 4, then so that the FM signal from the input terminal 1 is inputted to the FM demodulation circuit 4, the FM demodulation circuit 4 can obtain a satisfactory characteristic, that is, demodulation sensitivity independent of dispersions in the resistance value of the resistor and the capacity value of a condenser which constitute the FM demodulation circuit 4.

Besides, since the characteristic is controlled based on the FM demodulation circuit 4 itself, the foregoing structure requires no reference circuit for dispersion adjustment aside from the FM demodulation circuit 4, and the structure allows adjustment including influences by relative errors in the resistance value of the resistor and the capacity value of the condenser which constitute the FM demodulation circuit 4.

Figure 2:
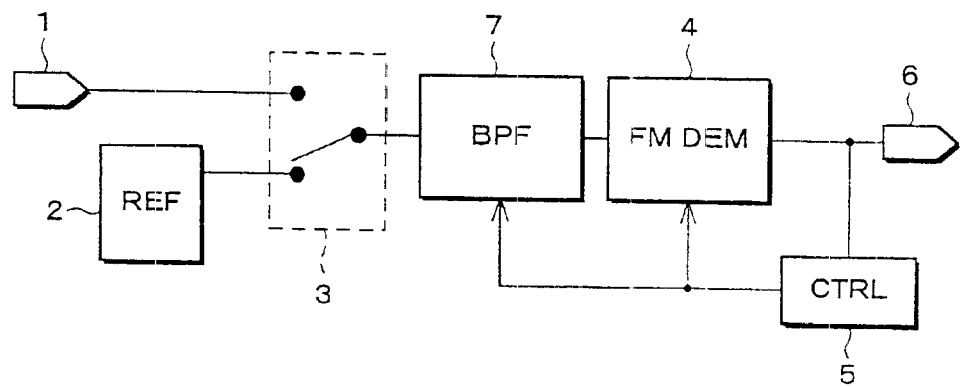
FIG. 2 is a block diagram showing a schematic structure of a demodulator in accordance with another embodiment of the present invention.

Next, examination will be given on a demodulator in which a band pass filter (BPF) 7 for limiting a receiving channel is provided between the switch circuit 3 and the FM demodulation circuit 4 in the demodulator shown in FIG. 1, that is, on a receiving path of the demodulator, as shown in FIG. 2.

The control signal from the control circuit 5 is arranged so as to be inputted not only to the FM demodulation circuit 4 but also to the BPF 7, and the characteristic, that is, the frequency characteristic of the BPF 7 is controlled to be stabilized. The control signal here is the control signal obtained in a state in which the characteristic of the FM demodulation circuit 4 is stabilized by the control circuit 5, and the characteristic of the BPF 7 is also stabilized by inputting the control signal also to the BPF 7.

This is because both the demodulation sensitivity of the FM demodulation circuit 4 and the frequency characteristic of a filter circuit such as the BPF 7 structured in an IC provided with the demodulator are generally determined by the product of the resistance value of the resistor and the capacity value of the condenser which constitute the respective circuits, and vary in the same way depending on dispersions in absolute values of the resistance value and the capacity value in the IC.

Figure 3:
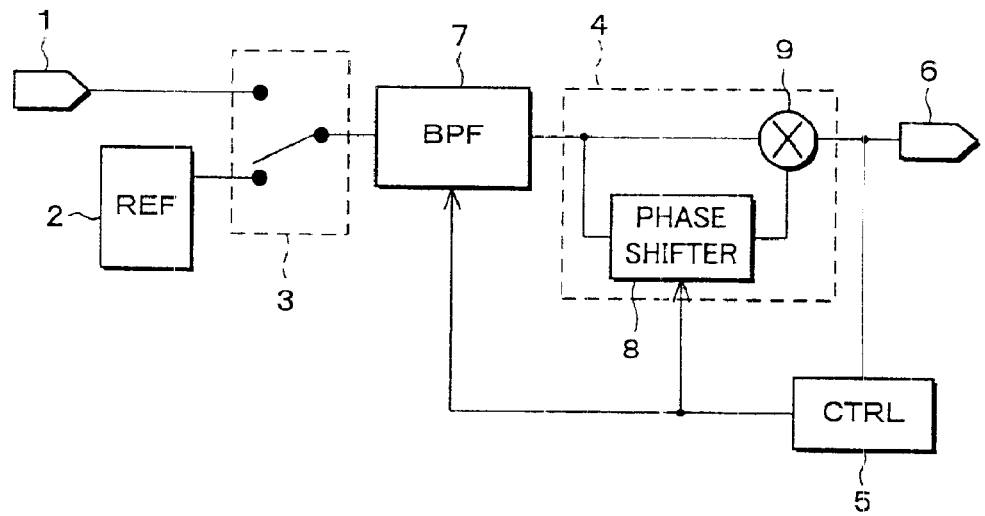
FIG. 3 is a block diagram showing a schematic structure of a demodulator in accordance with still another embodiment of the present invention.

In the demodulator shown in FIG. 2, the FM demodulation circuit 4 is constituted by a phase shifter 8 and a phase comparator 9, as shown in FIG. 3.

Here, by using a filter circuit to realize the phase shifter 8, and by making the structure of the filter circuit the same as that of a filter circuit which constitutes the BPF 7, it becomes possible to make the FM demodulation circuit 4 and the BPF 7 similarly affected not only by the dispersions in the resistance value and the capacity value, but also by variations in such as transistors constituting the respective circuits, ambient temperature, power source voltage, etc., allowing more stable control on the characteristic of the BPF 7.

Meanwhile, the output signal from the FM demodulation circuit 4 includes not only the demodulated signal obtained by demodulating the input signal (FM signal) but also an unwanted signal component.

Figure 4:
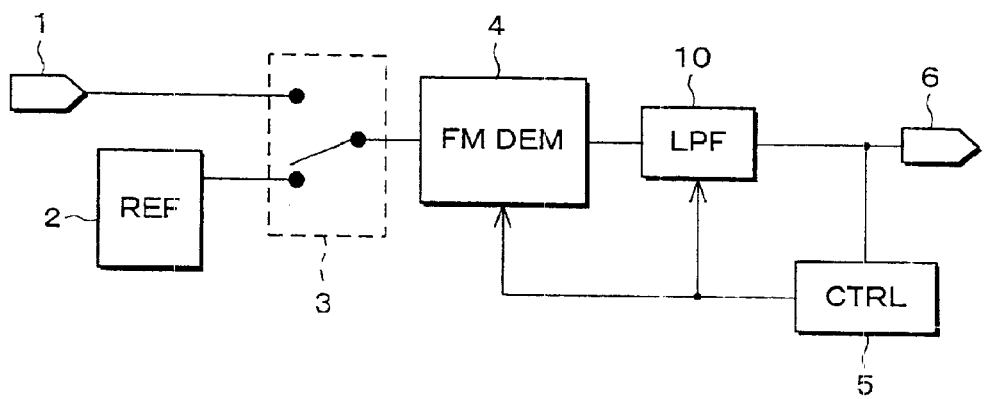
FIG. 4 is a block diagram showing a schematic structure of a demodulator in accordance with still another embodiment of the present invention.

Therefore, it can be considered to provide a low pass filter (LPF) 10 in a stage after the FM demodulation circuit 4, as a circuit for attenuating the unwanted signal component included in the output signal from the FM demodulation circuit 4, as shown in FIG. 4. This LPF 10 is a filter circuit for letting the output signal from the FM demodulation circuit 4 pass through it, removing the unwanted signal component, and extracting only the demodulated signal from the output signal.

Meanwhile, when the FM demodulation circuit 4 is constituted by the phase shifter 8 and the phase comparator 9 as shown in FIG. 3, the output of the FM demodulation circuit 4 includes not only the demodulated signal, but also a frequency component having double the frequency of the input signal (FM signal) to the FM demodulation circuit 4, as the unwanted signal component.

In this manner, in order to let the output signal from the FM demodulation circuit 4 pass through the LPF 10 and extract only the demodulated signal as much as possible when the FM demodulation circuit 4 is constituted by the phase shifter 8 and the phase comparator 9, the LPF 10 is required to greatly attenuate the frequency component having double the frequency of the input signal without attenuating the demodulated signal.

Here, when the frequency of the FM signal inputted to the FM demodulation circuit 4 is not so high compared with that of the demodulated signal, the frequency characteristic of the LPF 10 is requested to be stable.

Therefore, when the LPF 10 is also provided in the IC, the characteristic of the LPF 10 can be stabilized by using the control signal from the control circuit 5, which stabilizes the characteristic of the FM demodulation circuit 4, also for the LPF 10, utilizing that the frequency characteristic of the LPF 10 is represented by the product of the resistance value of the resistor and the capacity value of the condenser which constitute the LPF 10.

Figure 5:
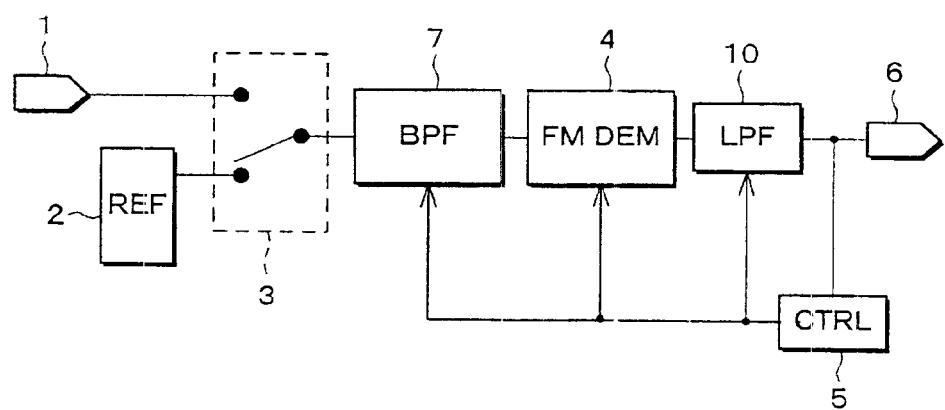
FIG. 5 is a block diagram showing a schematic structure of a demodulator in accordance with still another embodiment of the present invention.

Besides, as shown in FIG. 5, a system for receiving an FM signal in a demodulator may be structured so as to include the BPF 7 provided in a stage before the FM demodulation circuit 4, and the LPF 10 provided in a stage after the FM demodulation circuit 4.

Here, the characteristic of the BPF 7 is stabilized by controlling the BPF 7 by the control signal for controlling the characteristic of the FM demodulation circuit 4 so as to be stabilized, and the characteristic of the LPF 10 is also stabilized by controlling the LPF 10 by the same control signal. Consequently, a demodulator having a stable characteristic as a whole can be obtained without causing increases in circuit scale and current consumption.

[Second Embodiment]

The following description will explain another embodiment of the present invention. Incidentally, in the present embodiment, explanation will be given on a demodulator which uses a frequency modulated complex signal and demodulates the complex signal. The members having the same structure (function) as those in the above-mentioned embodiment will be designated by the same reference numerals and their description will be omitted.

Figure 6:
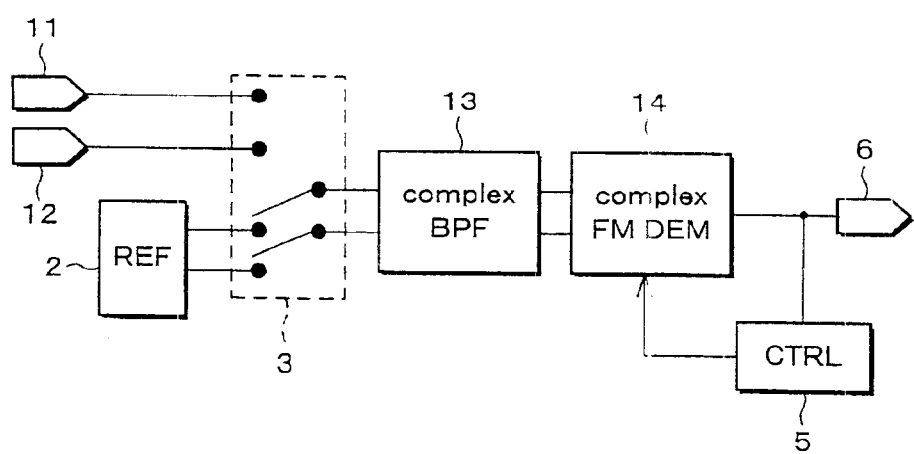
FIG. 6 is a block diagram showing a schematic structure of a demodulator in accordance with still another embodiment of the present invention.

As shown in FIG. 6, in the demodulator in accordance with the present embodiment, the reference signal generator (REF) 2 for generating a reference signal, the switch circuit 3 for switching between the FM signal from the input terminal 1 and the reference signal from the reference signal generator 2, and the output terminal 6 for outputting a demodulated signal are the same as those in the demodulator of the first embodiment shown in FIG. 1, and thus their description will be omitted.

The demodulator shown in FIG. 6 further includes input terminals 11, 12 to which a signal having I component (I signal) and a signal having Q component (Q signal) of the complex signal are inputted respectively, a complex BPF 13, a complex demodulation circuit (complex FM DEM) 14, and the control circuit (CTRL) 5 for controlling a characteristic of the complex demodulation circuit 14.

The above-structured demodulator is supposed to be integrated and built into an integrated circuit (hereinafter referred to as an IC) together with other circuits, etc.

Here, since the complex signal can propagate a negative frequency component, the complex BPF 13 can perform image removal for the overall demodulator by adopting the complex BPF 13 to the demodulator. Besides, since the complex BPF 13 is easy to be designed so as to steeply attenuate an out-of-band signal, the complex BPF 13 allows simpler construction of a receiver system provided with a demodulator.

The complex demodulation circuit 14 is structured so as to demodulate the I signal and the Q signal of the inputted complex signal respectively, and an output signal from the complex demodulation circuit 14 has the demodulated signal but does not include an unwanted signal component. Thus, the LPF 10 for attenuating an unwanted signal component, which is required in the first embodiment, just has to attenuate only noise, and a stable characteristic required in the first embodiment is not required, permitting to simplify the circuit structure in a stage after the complex demodulation circuit 14.

As in the first embodiment, reference signals from the reference signal generator 2 are demodulated by the complex demodulation circuit 14, and based on the demodulated signals, the characteristic of the complex demodulation circuit 14 is controlled by the control circuit 5. Here, as for the reference signals outputted from the reference signal generator 2, a reference signal corresponding to the I signal of the complex signal and a reference signal corresponding to the Q signal of the complex signal are respectively inputted to the complex BPF 13.

Figure 7:
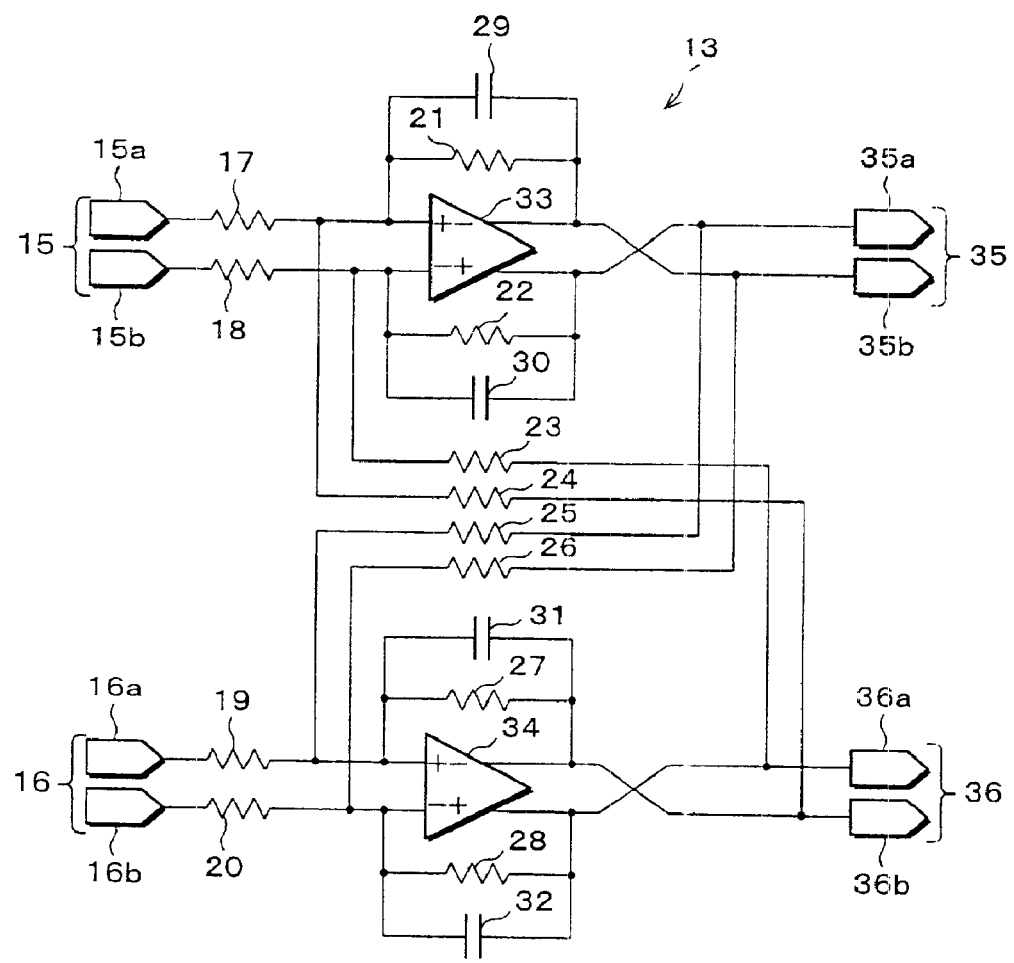
FIG. 7 is a block diagram showing a schematic structure of a complex band pass filter (BPF) provided in the demodulator shown in FIG. 6.

FIG. 7 shows an example of a structure of the complex BPF 13. The complex BPF 13 shown in FIG. 7 is structured so as to include a differential input terminal 15 (a first and a second input terminals) and a differential input terminal 16 (a third and a fourth input terminals) to which the complex signal is inputted, resistors 17 through 28 as a first through a twelfth resistors, condensers 29 through 32 as a first through a fourth condensers, an operational amplifier 33 (a first operational amplifier) and an operational amplifier 34 (a second operational amplifier), and a differential output terminal 35 (a first and a second output terminals) and a differential output terminal 36 (a third and a fourth output terminals) to which the complex signal is inputted.

Specifically, as shown in FIG. 7, the complex BPF 13 may be structured such that a first input terminal 15a of the differential input terminal 15 is connected via the resistor 17 (the first resistor) to a positive input terminal of the operational amplifier 33 (the first operational amplifier), one end of the condenser 29 (the first condenser), one end of the resistor 21 (the second resistor), and one end of the resistor 24 (the third resistor); a second input terminal 15b of the differential input terminal 15 is connected via the resistor 18 (the fourth resistor) to a negative input terminal of the operational amplifier 33, one end of the condenser 30 (the second condenser), one end of the resistor 22 (the fifth resistor), and one end of the resistor 23 (the sixth resistor); a third input terminal 16a of the differential input terminal 16 is connected via the resistor 19 (the seventh resistor) to a positive input terminal of the operational amplifier 34 (the second operational amplifier), one end of the condenser 31 (the third condenser), one end of the resistor 27 (the eighth resistor), and one end of the resistor 25 (the ninth resistor); a fourth input terminal 16b of the differential input terminal 16 is connected via the resistor 20 (the tenth resistor) to a negative input terminal of the operational amplifier 34, one end of the condenser 32 (the fourth condenser), one end of the resistor 28 (the eleventh resistor), and one end of the resistor 26 (the twelfth resistor); a first output terminal 35a of the differential output terminal 35 is connected to a positive output terminal of the operational amplifier 33, the other end of the condenser 30, the other end of the resistor 22, and the other end of the resistor 25; a second output terminal 35b of the differential output terminal 35 is connected to a negative output terminal of the operational amplifier 33, the other end of the condenser 29, the other end of the resistor 21, and the other end of the resistor 26; a third output terminal 36a of the differential output terminal 36 is connected to a positive output terminal of the operational amplifier 34, the other end of the condenser 32, the other end of the resistor 28, and the other end of the resistor 23; and a fourth output terminal 36b of the differential output terminal 36 is connected to a negative output terminal of the operational amplifier 34, the other end of the condenser 31, the other end of the resistor 27, and the other end of the resistor 24.

A differential signal of the I signal of the complex signal is inputted to the differential input terminal 15, and a differential signal of the Q signal of the complex signal is inputted to the differential input terminal 16.

The differential signal inputted from the differential input terminal 15 is inputted to the operational amplifier 33 and amplified, then the amplified signal is outputted from the differential output terminal 35 together with the differential signal inputted from the differential input terminal 16; and the differential signal inputted from the differential input terminal 16 is inputted to the operational amplifier 34 and amplified, then the amplified signal is outputted from the differential output terminal 36 together with the differential signal inputted from the differential input terminal 15.

With this structure, the complex BPF 13 changes the frequency characteristic with respect to the I signal and the Q signal of the inputted complex signal. Incidentally, in addition to the I signal and the Q signal of the complex signal, the reference signal from the reference signal generator 2 is also inputted to the complex BPF 13, and the reference signal is subjected to the same processing.

In the complex BPF 13 having the foregoing structure, the frequency characteristic is determined by the resistance values of the resistors 17 through 28 and the capacity value of the condensers 29 through 32.

Figure 8:
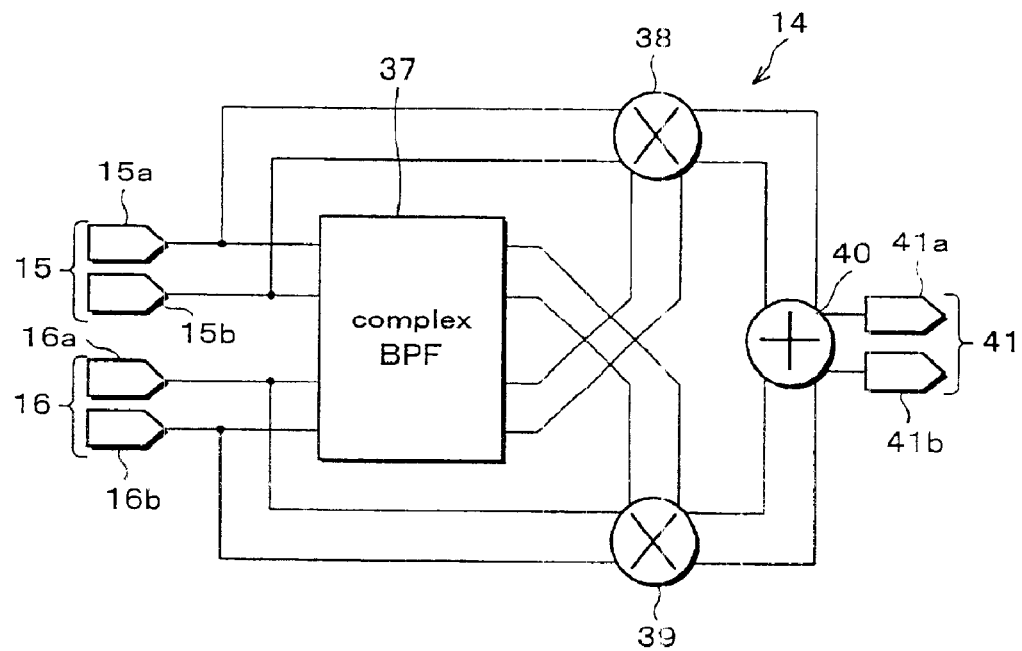
FIG. 8 is a block diagram showing a schematic structure of a complex modulation circuit provided in the demodulator shown in FIG. 6.

Next, FIG. 8 shows an example of a structure of the complex demodulation circuit 14. The complex demodulation circuit 14 shown in FIG. 8 is structured so as to include the differential input terminal 15 (the first and the second input terminals) and the differential input terminal 16 (the third and the fourth input terminals), a complex band pass filter (complex BPF) 37 having the same structure as that of the complex BPF 13 shown in FIG. 17, a phase comparator 38 (a first multiplier) and a phase comparator 39 (a second multiplier), an adder 40, and a demodulated signal output terminal 41.

Specifically, as shown in FIG. 8, the complex demodulation circuit 14 is structured such that the first input terminal 15a of the differential input terminal 15 is connected to a first input terminal of the complex BPF 37 and to a first input terminal of the phase comparator 38 (the first multiplier); the second input terminal 15b of the differential input terminal 15 is connected to a second input terminal of the complex BPF 37 and to a second input terminal of the phase comparator 38; the third input terminal 16a of the differential input terminal 16 is connected to a third input terminal of the complex BPF 37 and to a first input terminal of the phase comparator 39 (the second multiplier); the fourth input terminal 16b of the differential input terminal 16 is connected to a fourth input terminal of the complex BPF 37 and to a second input terminal of the phase comparator 39; a first output terminal of the complex BPF 37 is connected to a third input terminal of the phase comparator 39; a second output terminal of the complex BPF 37 is connected to a fourth input terminal of the phase comparator 39; a third output terminal of the complex BPF 37 is connected to a third input terminal of the phase comparator 38; a fourth output terminal of the complex BPF 37 is connected to a fourth input terminal of the phase comparator 38; a first output terminal of the phase comparator 38 is connected to a first input terminal of the adder 40; a second output terminal of the phase comparator 38 is connected to a second input terminal of the adder 40; a first output terminal of the phase comparator 39 is connected to a third input terminal of the adder 40; a second output terminal of the phase comparator 39 is connected to a fourth input terminal of the adder 40; and a first output terminal and a second output terminal of the adder 40 are a first output terminal 41a and a second output terminal 41b of the demodulated signal output terminal 41.

In the complex demodulation circuit 14, the signal inputted from the differential input terminal 15 is the differential signal outputted from the differential output terminal 35 of the complex BPF 13 shown in FIG. 7, and the signal inputted from the differential input terminal 16 is the differential signal outputted from the differential output terminal 36 of the complex BPF 13 shown in FIG. 7.

The differential signal (I signal) inputted to the differential input terminal 15 is inputted to the complex BPF 37, and is also inputted to the phase comparator 38. The differential signal (Q signal) inputted to the differential input terminal 16 is inputted to the complex BPF 37, and is also inputted to the phase comparator 39.

In the complex BPF 37, the frequency characteristic is changed with respect to the inputted differential signals (I signal, Q signal), and the I signal is inputted to the phase comparator 39, and the Q signal is inputted to the phase comparator 38.

The phase comparator 38 compares the phase of the differential signal of the I signal directly inputted from the differential input terminal 15 and the phase of the Q signal whose frequency characteristic is changed by the complex BPF 37, and the comparison result is supplied to the adder 40. The phase comparator 39 compares the phase of the differential signal of the Q signal directly inputted from the differential input terminal 16 and the phase of the I signal whose frequency characteristic is changed by the complex BPF 37, and the comparison result is supplied to the adder 40.

The adder 40 adds the respective phase comparison results supplied from the phase comparators 38 and 39, and outputs the addition result from the demodulated signal output terminal 41.

Therefore, when a demodulator for a complex signal is structured by adopting a circuit which has the complex BPF shown in FIG. 7 or a plurality of the complex BPF connected in series as the complex BPF 13 shown in FIG. 6, and by adopting the circuit shown in FIG. 8 as the complex demodulation circuit 14 shown in FIG. 6, the complex BPF 13 can realize satisfactory characteristics on image removal and out-of-band attenuation amount, and the complex demodulation circuit 14 allows relatively simple structure of the circuit after the complex demodulation circuit 14.

Figure 9:
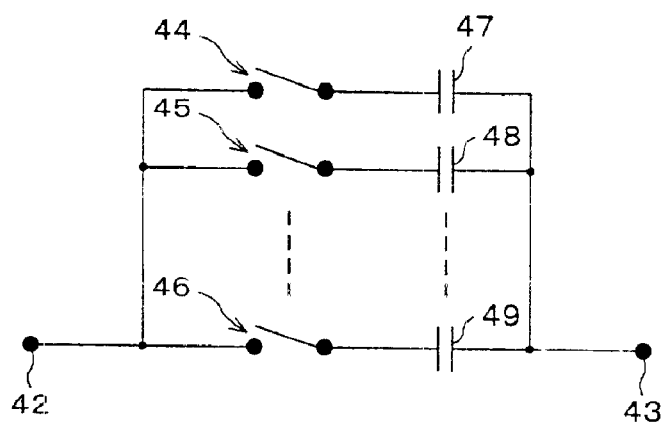
FIG. 9 is a block diagram showing a schematic structure of frequency characteristics changeable means provided in the BPF.

Here, referring to FIG. 9, the following description will explain frequency characteristic changeable means for changing a frequency characteristic in the BPF 7 or in the complex BPF 13, etc.

As the frequency characteristic changeable means, a condenser switching circuit shown in FIG. 9 can be considered. The condenser switching circuit is structured so as to include condensers 47, 48, 49, connecting terminals 42, 43 for the condensers, and switches 44, 45, 46 for switching the capacity values of the condensers.

For example, in order to switch the resistance values when using the complex BPF 13 as shown in FIG. 7, it is necessary to switch all the resistors 17 to 28 shown in FIG. 7 in the same way, and a plurality of switching circuits for switching are required. However, when using a condenser switching circuit as shown in FIG. 9, it is satisfactory to provide the switching circuits at the condensers 29 to 32, substantially reducing the number of the switching circuits.

That is, the complex FM demodulation circuit shown in FIG. 8 includes the complex BPF. Therefore, since the complex BPF is the main member whose characteristic is dispersed due to IC manufacturing dispersion, among the members constituting the complex FM demodulation circuit, in order to control the characteristic of the complex FM demodulation circuit, it is satisfactory to control the characteristic of the complex BPF.

Consequently, by using the condenser switching circuit shown in FIG. 9 as mentioned above, the characteristic of the complex BPF 13 shown in FIG. 7 can be controlled.

Figure 11:
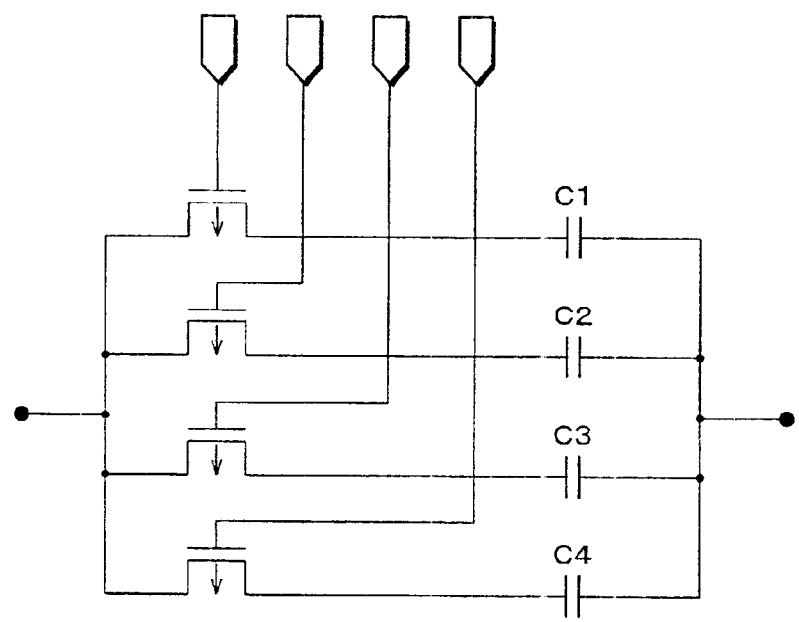
FIG. 11 is a block diagram showing a schematic structure of one example of a control circuit for controlling a capacity value of a condenser in the complex BPF shown in FIG. 7.

Specifically, the characteristic of the complex BPF 13 shown in FIG. 7 is controlled by switching the capacity values of the respective condensers in a digital manner. For example, by using a block circuit as shown in FIG. 11 and setting the capacity values of condensers C1 to C4 so as to have weights of 1:2:4:8, respectively, the capacity values can be set in 4 bits=16 types. Here, the condensers C1 to C4 shown in FIG. 11 correspond to the condensers 29 to 32 shown in FIG. 7.

Besides, by setting the capacity values of the condensers 29 to 32 shown in FIG. 7 as C, 2×C, . . . , n×C, respectively, required capacity values can be achieved efficiently.

In this manner, the demodulators described in the first and the second embodiments can be appropriately used in a wireless communication device.

[Third Embodiment]

The following description will explain still another embodiment of the present invention. Incidentally, in the present embodiment, explanation will be given on an example in which the demodulator shown in FIG. 5 in the first embodiment is applied to a wireless communication device which performs wireless communication as a communication device.

The wireless communication device in accordance with the present embodiment is structured so as to include a signal receiving section and a signal transmitting section.

Figure 10:
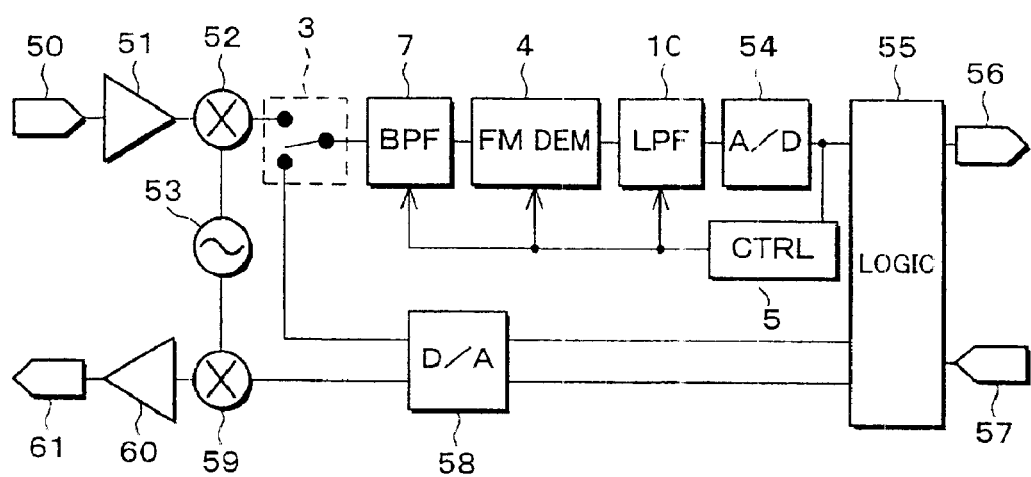
FIG. 10 is a block diagram showing a schematic structure of a wireless communication device provided with the demodulator of the present invention.

As shown in FIG. 10, the foregoing receiving section includes an input terminal 50 to which a receiving signal is inputted, an amplifier 51 for amplifying the receiving signal, a mixer 52 for converting a frequency of the receiving signal, a local oscillator 53 for providing a local signal to the mixer 52, an A/D converter 54 for converting a demodulated analog signal outputted from the FM demodulation circuit 4 to a digital signal, a logic circuit 55 for processing the digital signal outputted from the A/D converter 54, and an output terminal 56 for outputting receiving data outputted from the logic circuit 55, in addition to the demodulator (the switch circuit 3, the FM demodulation circuit 4, the control circuit 5, the BPF 7, the LPF 10).

Besides, as shown in FIG. 10, the foregoing transmitting section includes a transmitting data input terminal 57, a D/A converter 58 for converting the digital signal supplied from the logic circuit 55 to an analog signal, a mixer 59 for converting a frequency of a base band signal outputted from the D/A converter 58 by using the local signal outputted from the local oscillator 53, an amplifier 60 for amplifying a transmitting signal outputted from the mixer 59, and an output terminal 61 for outputting the transmitting signal.

In the wireless communication device having the foregoing structure, a reference signal used for controlling the demodulation sensitivity of the FM demodulation circuit 4 by the control circuit 5 is supplied from the D/A converter 58. Therefore, there is no need to additionally provide the reference signal generator 2, which is necessary in the first and the second embodiments.

Besides, as for the demodulation sensitivity of the FM demodulation circuit 4, as in the case of the first and the second embodiments, the control circuit 5 controls the characteristic based on the signal from the FM demodulation circuit 4, that is, a signal obtained by demodulating the reference signal from the D/A converter 58. Therefore, it becomes possible to realize a wireless communication device having the BPF 7 and the FM demodulation circuit 4 which are not subjected to variations in the characteristic due to dispersions among the ICs, with a relatively small-scale circuit structure and a relatively low power consumption.

As has been explained, the present invention can realize a receiver which includes a demodulator having less circuit structure and restrained current consumption. Besides, the characteristic of the demodulator can be easily stabilized by eliminating the influence by relative errors in resistance values and capacity values in an IC.

As the foregoing wireless communication device, a communication device for Bluetooth is appropriately used, according to the following reasons.

The communication device for Bluetooth can be appropriately used as a wireless communication device provided with the demodulator of the present invention, since it has the following two advantages: (1) since the communication device for Bluetooth performs receiving operation intermittently, the FM demodulation circuit does not have to perform receiving operation all the time; and (2) the receiving signal of the communication device for Bluetooth is an FSK modulation signal, and the communication device for Bluetooth often includes a digital circuit within a chip since timing control for a circuit block is required, and thus an adjustment of an analog circuit in a digital manner can be processed inside an IC.

Incidentally, in the present embodiment, explanation has been given on the wireless communication device as a communication device. However, the present invention is not limited to this, and can be applied to a communication device as long as the communication device has a circuit like the FM demodulation circuit. Therefore, the communication device may be a wire communication device, and the present invention can be appropriately used also for a communication device having stable demodulation sensitivity.

The demodulator of the present invention is structured so as to include:

a demodulation circuit for demodulating a modulated signal; and a control circuit for controlling a characteristic of the demodulation circuit so that an output value of a demodulated signal obtained when a reference signal used for controlling the characteristic of the demodulation circuit is inputted to the demodulation circuit becomes a specified value.

Therefore, since the control circuit is arranged so as to control the characteristic of the demodulation circuit based on the demodulated signal obtained when the reference signal used for controlling the characteristic of the demodulation circuit is inputted to the demodulation circuit, the characteristic of the demodulation circuit can be automatically controlled just by inputting the reference signal to the demodulation circuit.

Here, the characteristic of the demodulation circuit means demodulation sensitivity, and for example, when a filter circuit and a phase shifter are used as frequency characteristic changeable means in the demodulation circuit, frequency characteristics of the filter circuit and the phase shifter indicate demodulation sensitivities.

Furthermore, in the foregoing structure, the control on the characteristic of the demodulation circuit, for example, stabilization of demodulation sensitivity, is carried out based on the demodulated signal obtained when the reference signal is inputted to the demodulation circuit which is the subject of the control. Therefore, overall circuit scale of the demodulator can be reduced compared with a conventional case where the characteristic of the demodulation circuit is controlled by using the result in a circuit for characteristic control which is provided aside from the demodulation circuit, resulting in restraining a current consumed in the circuit.

Besides, the control on the characteristic of the demodulation circuit means control for stabilizing modulation sensitivity, which is a characteristic of the demodulation circuit, at a constant level. Thus, it is sufficient to set the foregoing specified value at a value targeted for making the modulation sensitivity of the demodulation circuit at a constant level (a target value). With this arrangement, by comparing the output value of the demodulated signal obtained from the demodulation circuit to which the reference signal is inputted with the foregoing specified value, it becomes possible to detect dispersions in demodulation sensitivity of the demodulation circuit due to dispersions in absolute values of the resistance value of the resistor and the capacity value of the condenser included in an IC into which the demodulator is integrated, by letting the reference signal pass through the demodulation circuit. Then, by controlling this detection result, that is, the output signal from the demodulation circuit, by the control circuit so as to be the specified value, the characteristic of the demodulation circuit can be automatically controlled.

Here, the following description will explain the specified value when demodulating a frequency modulated signal (FM signal) as a modulated signal.

When a signal having a constant frequency is inputted to a demodulator for demodulating an FM signal (an FM demodulator), DC voltage in accordance with the frequency of the input signal appears in the output of the FM demodulator. Dispersions in the DC voltage are caused by manufacturing dispersions (especially, dispersions in the resistance value of the resistor and the capacity value of the condenser) when the FM demodulator is integrated. This DC voltage is compared with the reference signal, and the characteristic of the FM demodulator is adjusted so that the DC voltage becomes constant. With this adjustment, an FM demodulator having a constant frequency characteristic can be realized.

Figure 13:
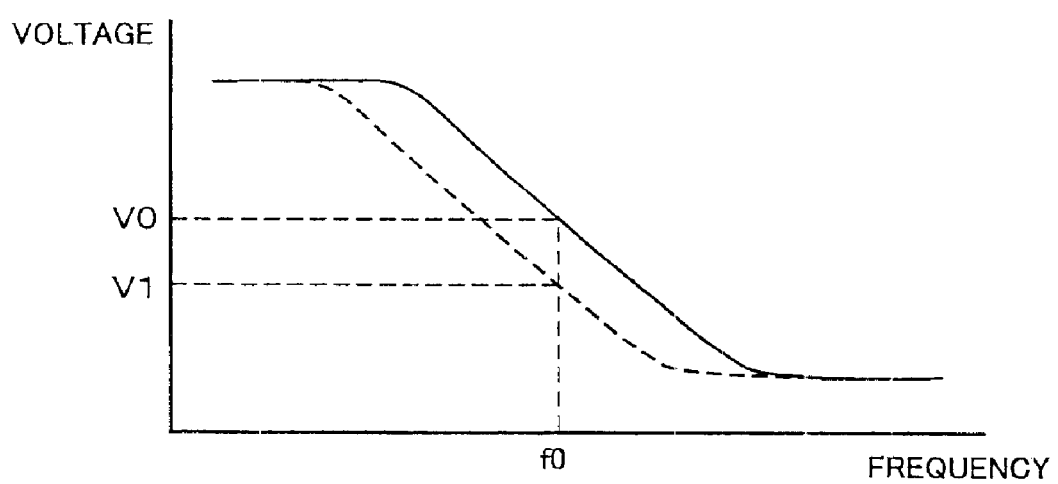
FIG. 13 is a graph showing a relationship between a frequency and a voltage of an input signal in the demodulator.
Figure 14:
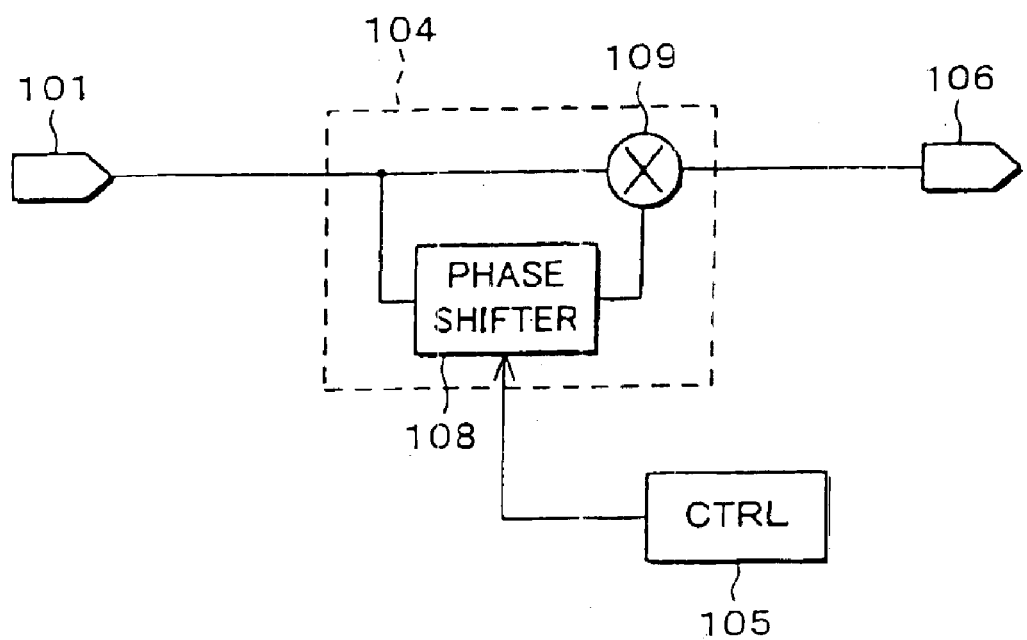
FIG. 14 is a block diagram showing a schematic structure of a conventional demodulator.

For example, in the graph shown in FIG. 13 in which the solid line represents the original characteristic of the FM demodulator and the broken line represents the characteristic of the FM demodulator having dispersions in the resistance value of the resistor and the capacity value of the condenser, when a signal having a frequency f0 is inputted, the output of V0 is originally required, but the output becomes V1 due to the dispersions in the resistance value and the capacity value. Hence, when making the signal with the frequency f0 a reference signal, the control circuit controls the characteristic of the FM demodulator so that the output of the FM demodulator when the reference signal is inputted always becomes V1, and thus controls the characteristic of the FM demodulation circuit.

Further, the modulated signal to be demodulated by the demodulator of the present invention includes not only the above-mentioned frequency modulated signal (FM signal), but also, for example, an amplitude modulated signal (AM signal) and a phase modulated signal (PM signal), etc. In demodulating either of the modulated signals, either signal can be demodulated stably as long as the characteristic of each demodulation circuit is controlled based on the demodulated signal obtained when a reference signal is inputted to each demodulation circuit, as in the foregoing structure.

Besides, in the demodulator having the foregoing structure, when controlling the characteristic of the demodulation circuit, the demodulation circuit has to demodulate an inputted modulated signal while receiving a signal, and during that period it is not possible to input the reference signal to the demodulation circuit and detect dispersions in the characteristic of the FM demodulation circuit. However, for example, in a device such as a Bluetooth receiver which intermittently performs receiving operation, it can be arranged that, while the device does not perform receiving operation, the reference signal is inputted to the demodulation circuit and the characteristic of the demodulation circuit is controlled by the control circuit so that the output of the demodulation circuit becomes a specified value, and while the device performs receiving operation, the characteristic of the demodulation circuit is maintained in a state after being controlled. Consequently, it becomes possible to obtain stable demodulation sensitivity of the demodulation circuit.

The demodulator of the present invention, which is a demodulator for demodulating a modulated signal whose frequency is modulated, may be structured so as to include:

a demodulation circuit having frequency characteristic changeable means for changing a frequency characteristic of an input signal; and a control circuit for controlling a frequency characteristic of the demodulation circuit so that an output value of a demodulated signal obtained when a reference signal used for controlling a characteristic of the demodulation circuit is inputted to the demodulation circuit becomes a specified value.

Therefore, it becomes possible to detect dispersions in demodulation sensitivity of the demodulation circuit due to dispersions in absolute values of the resistance value of the resistor and the capacity value of the condenser included in an IC into which the demodulator is integrated, by letting the reference signal pass through the demodulation circuit. Then, by controlling this detection result, that is, the output signal from the demodulation circuit, by the control circuit so as to be the specified value, the characteristic of the demodulation circuit can be automatically controlled.

Here, the characteristic of the demodulation circuit means demodulation sensitivity, and for example, when a filter circuit and a phase shifter are used in the demodulation circuit for demodulating a frequency modulated signal (FM signal) as a modulated signal, frequency characteristics of the filter circuit and the phase shifter indicate demodulation sensitivities.

In this manner, since the demodulation circuit includes the frequency characteristic changeable means, the demodulation sensitivity is controlled by controlling the frequency characteristic. Therefore, the control circuit is arranged to control the frequency characteristic of the demodulation circuit so that the output value of the demodulated signal obtained when the reference signal used for controlling the characteristic of the demodulation circuit is inputted to the demodulation circuit becomes the specified value.

The control on the characteristic of the demodulation circuit means control for stabilizing modulation sensitivity, which is a characteristic of the demodulation circuit, at a constant level. Thus, it is sufficient to set the foregoing specified value at a value targeted for making the modulation sensitivity of the demodulation circuit at a constant level (a target value) . In other words, it is sufficient to control the characteristic, that is, the frequency characteristic, of frequency characteristic changeable means of the demodulation circuit so as to be at a constant level.

It may be structured that a band pass filter having frequency characteristic changeable means for changing a frequency characteristic of an input signal is provided in a former stage of the demodulation circuit, and that the characteristic of the band pass filter is controlled by the control circuit.

In this case, since the band pass filter has the frequency characteristic changeable means, the characteristic of the band pass filter is controlled by controlling the frequency characteristic.

Consequently, since the control circuit can control not only the characteristic of the demodulation circuit but also the characteristic of the band pass filter, there is no need to provide an additional circuit for controlling the characteristic of the band pass filter, and thus the overall characteristic of the demodulator can be stabilized with an simpler circuit structure.

Besides, in the demodulator having the foregoing structure, the reference signal is first inputted to the band pass filter, then to the demodulation circuit. Therefore, the band pass filter and the demodulation circuit are under the same environment, that is, they are affected in the same way by the dispersions in the resistance value of the resistor and the capacity value of the condenser which constitute the demodulator.

With this structure, when the demodulation circuit is provided with a phase shifter including a filter circuit as frequency characteristic changeable means, by adopting the same circuit structure to the filter circuit included in the phase shifter and to a filter circuit included in the band pass filter, the demodulation circuit and the band pass filter can be stabilized in the same way by the control by the control circuit.

That is, it is satisfactory that the demodulation circuit is provided with a phase shifter including a filter circuit as the frequency characteristic changeable means, and that the filter circuit included in the phase shifter and the filter circuit included in the band pass filter are arranged to have the same circuit structure.

It may be structured that a low pass filter having frequency characteristic changeable means for changing a frequency characteristic of an input signal is provided in a later stage of the demodulation circuit, and that the characteristic of the low pass filter is controlled by the control circuit.

Generally, the output signal from the demodulation circuit includes not only the demodulated signal but also an unwanted signal component. Therefore, by providing the low pass filter in the stage after the demodulation circuit as mentioned above, the unwanted signal component can be attenuated from the output signal of the demodulation circuit.

Besides, since the low pass filter includes the frequency characteristic changeable means, the characteristic of the low pass filter can be controlled by controlling the frequency characteristic. That is, the characteristic of the low pass filter can be controlled in the same way as the control on the characteristic of the demodulation circuit controlling the frequency characteristic.

Therefore, the characteristic of the low pass filter and that of the demodulation circuit can be controlled by a common control circuit, eliminating the need to provide an additional circuit for controlling the characteristic of the low pass filter. As a result, increases in the overall circuit scale of the demodulator and in the power consumption of the circuit can be prevented.

The foregoing modulated signal and reference signal may be complex signals.

In this case, since the complex signal can propagate a negative frequency component, by using the band pass filter which processes the complex signal, the band pass filter can perform image removal, resulting in simplifying the structure of a receiver.

Besides, the output of the FM demodulation circuit for the complex signal does not include an unwanted signal component. Therefore, the low pass filter for attenuating the unwanted signal component is satisfactory as long as it has a characteristic enough to attenuate only noise, and there is no need to severely control the characteristic.

In this manner, if the demodulated signal and the reference signal are the complex signals, there is no need to provide a circuit for attenuating the unwanted signal component in the stage after the demodulation circuit. Consequently, the circuit structure in the stage after the demodulation circuit can be simplified, resulting in the reduction in the overall circuit scale of the demodulator and the decrease in power consumption in the circuit.

The band pass filter when using the complex signal may be structured so as to have at least one stage of a complex band pass filter connected in series, the complex band pass filter being structured such that:

a first input terminal is connected via a first resistor to a positive input terminal of a first operational amplifier, one end of a first condenser, one end of a second resistor, and one end of a third resistor;

a second input terminal is connected via a fourth resistor to a negative input terminal of the first operational amplifier, one end of a second condenser, one end of a fifth resistor, and one end of a sixth resistor;

a third input terminal is connected via a seventh resistor to a positive input terminal of a second operational amplifier, one end of a third condenser, one end of an eighth resistor, and one end of a ninth resistor;

a fourth input terminal is connected via a tenth resistor to a negative input terminal of the second operational amplifier, one end of a fourth condenser, one end of an eleventh resistor, and one end of a twelfth resistor;

a first output terminal is connected to a positive output terminal of the first operational amplifier, the other end of the second condenser, the other end of the fifth resistor, and the other end of the ninth resistor;

a second output terminal is connected to a negative output terminal of the first operational amplifier, the other end of the first condenser, the other end of the second resistor, and the other end of the twelfth resistor;

a third output terminal is connected to a positive output terminal of the second operational amplifier, the other end of the fourth condenser, the other end of the eleventh resistor, and the other end of the sixth resistor; and a fourth output terminal is connected to a negative output terminal of the second operational amplifier, the other end of the third condenser, the other end of the eighth resistor, and the other end of the third resistor.

Besides, the demodulation circuit when using the complex signal may be structured such that:

the first input terminal is connected to a first input terminal of the complex band pass filter and to a first input terminal of a first multiplier;

the second input terminal is connected to a second input terminal of the complex band pass filter and to a second input terminal of the first multiplier;

the third input terminal is connected to a third input terminal of the complex band pass filter and to a first input terminal of a second multiplier;

the fourth input terminal is connected to a fourth input terminal of the complex band pass filter and to a second input terminal of the second multiplier;

a first output terminal of the complex band pass filter is connected to a third input terminal of the second multiplier;

a second output terminal of the complex band pass filter is connected to a fourth input terminal of the second multiplier;

a third output terminal of the complex band pass filter is connected to a third input terminal of the first multiplier;

a fourth output terminal of the complex band pass filter is connected to a fourth input terminal of the first multiplier;

a first output terminal of the first multiplier is connected to a first input terminal of an adder;

a second output terminal of the first multiplier is connected to a second input terminal of the adder;

a first output terminal of the second multiplier is connected to a third input terminal of the adder;

a second output terminal of the second multiplier is connected to a fourth input terminal of the adder; and a first output terminal and a second output terminal of the adder become a demodulated signal output terminal.

Besides, the frequency characteristic changeable means may be made up of a circuit which includes a plurality of condensers and switches for switching the respective condensers.

In this case, it becomes possible to switch the condensers, which are the members constituting the band pass filter provided fewer in number than the resistors. Therefore, the circuit structure can be simplified, and power consumption of the circuit can be reduced.

The foregoing demodulator may be used in a signal receiving section of a communication device for receiving/transmitting a modulated signal.

In this case, demodulation sensitivity is automatically stabilized in the demodulator of the receiving section, and thus receiving accuracy and demodulation accuracy of the modulated signal can be improved.

Further, it may be structured that a transmitting section which at least includes a digital-to-analog conversion circuit for converting a digitized signal to an analog signal is provided, and that an signal outputted from the digital-to-analog conversion circuit in the transmitting section is used as the reference signal in the demodulator of the receiving section.

In this case, since an signal outputted from the digital-to-analog conversion circuit in the transmitting section is used as the reference signal in the demodulator of the receiving section, there is no need to additionally provide a circuit for generating the reference signal. With this structure, the circuit structure of the communication device can be simplified and power consumption in the circuit of the communication device can be reduced.

Incidentally, a wireless communication device, a wire communication device, etc. can be considered as the communication device provided with the demodulator of the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A demodulator comprising:

a complex demodulation circuit for demodulating a complex modulated signal; and a control circuit for controlling a characteristic of the demodulation circuit so that an output value of a complex demodulated signal, obtained when a reference signal used for controlling the characteristic of the demodulation circuit is inputted to the demodulation circuit, becomes a specified value, wherein both the modulated signal and the demodulated signal are complex signals.

2. The demodulator of claim 1, wherein the demodulation circuit and control circuit are integrated on an integrated circuit chip.

3. The demodulator of claim 1, further comprising:

a reference signal generating circuit for generating the reference signal; and a switch for connecting the reference signal generating circuit to the demodulation circuit during control of a characteristic of the demodulation circuit.

4. The demodulator of claim 3, wherein the switch is further for disconnecting the reference signal generating circuit from the demodulation circuit and for connecting the demodulation circuit to receive an input signal, subsequent to control of a characteristic of the demodulation circuit.

5. The demodulator of claim 1, wherein the characteristic of the demodulation circuit is controlled by the control circuit based upon an output value of the demodulation circuit, resulting from the inputted reference signal, being fed back into the control circuit.

6. The demodulator as set forth in claim 1, wherein the characteristic of the demodulation circuit is demodulation sensitivity.

7. The demodulator as set forth in claim 6, wherein the control circuit maintains a state in which control of the characteristic is complete upon the modulated signal being input to the demodulation circuit.

8. The demodulator as set forth in claim 1, wherein the control circuit maintains a state in which control of the characteristic is complete upon the modulated signal being input to the demodulation circuit.

9. A demodulator for demodulating a modulated signal whose frequency is modulated, comprising:

a complex demodulation circuit having frequency characteristic changeable means for changing a frequency characteristic of a complex input signal; and a control circuit for controlling a frequency characteristic of the demodulation circuit so that an output of a demodulated signal, obtained when a reference signal used for controlling a characteristic of the demodulation circuit is inputted to the demodulation circuit, becomes a specified value, wherein both the input signal and the demodulated signal are complex signals.

10. The demodulator as set forth in claim 9, wherein:

a band pass filter having frequency characteristic changeable means for changing a frequency characteristic of an input signal is provided in a former stage of the demodulation circuit; and a characteristic of the band pass filter is controlled by the control circuit.

11. The demodulator as set forth in claim 10, wherein:

the demodulation circuit is provided with a phase shifter which includes a filter circuit as the frequency characteristic changeable means; and the filter circuit included in the phase shifter and a filter circuit of the band pass filter have the same circuit structure.

12. The demodulator as set forth in claim 10, wherein:

when the modulated signal and the demodulated signal are complex signals, the band pass filter is structured so as to have at least one stage of a complex band pass filter connected in series, the complex band pass filter being structured such that:

a first input terminal is connected via a first resistor to a positive input terminal of a first operational amplifier, one end of a first condenser, one end of a second resistor, and one end of a third resistor;

a second input terminal is connected via a fourth resistor to a negative input terminal of the first operational amplifier, one end of a second condenser, one end of a fifth resistor, and one end of a sixth resistor;

a third input terminal is connected via a seventh resistor to a positive input terminal of a second operational amplifier, one end of a third condenser, one end of an eighth resistor, and one end of a ninth resistor;

a fourth input terminal is connected via a tenth resistor to a negative input terminal of the second operational amplifier, one end of a fourth condenser, one end of an eleventh resistor, and one end of a twelfth resistor;

a first output terminal is connected to a positive output terminal of the first operational amplifier, the other end of the second condenser, the other end of the fifth resistor, and the other end of the ninth resistor;

a second output terminal is connected to a negative output terminal of the first operational amplifier, the other end of the first condenser, the other end of the second resistor, and the other end of the twelfth resistor;

a third output terminal is connected to a positive output terminal of the second operational amplifier, the other end of the fourth condenser, the other end of the eleventh resistor, and the other end of the sixth resistor; and a fourth output terminal is connected to a negative output terminal of the second operational amplifier, the other end of the third condenser, the other end of the eighth resistor, and the other end of the third resistor.

13. The demodulator as set forth in claim 12, wherein the demodulation circuit is structured such that:

the first input terminal is connected to a first input terminal of the complex band pass filter and to a first input terminal of a first multiplier;

the second input terminal is connected to a second input terminal of the complex band pass filter and to a second input terminal of the first multiplier;

the third input terminal is connected to a third input terminal of the complex band pass filter and to a first input terminal of a second multiplier;

the fourth input terminal is connected to a fourth input terminal of the complex band pass filter and to a second input terminal of the second multiplier;

a first output terminal of the complex band pass filter is connected to a third input terminal of the second multiplier;

a second output terminal of the complex band pass filter is connected to a fourth input terminal of the second multiplier;

a third output terminal of the complex band pass filter is connected to a third input terminal of the first multiplier;

a fourth output terminal of the complex band pass filter is connected to a fourth input terminal of the first multiplier;

a first output terminal of the first multiplier is connected to a first input terminal of an adder;

a second output terminal of the first multiplier is connected to a second input terminal of the adder;

a first output terminal of the second multiplier is connected to a third input terminal of the adder;

a second output terminal of the second multiplier is connected to a fourth input terminal of the adder; and a first output terminal and a second output terminal of the adder become a demodulated signal output terminal.

14. The demodulator of claim 9, wherein the demodulation circuit and control circuit are integrated on an integrated circuit chip.

15. The demodulator of claim 9, further comprising:
a reference signal generating circuit for generating the reference signal; and a switch for connecting the reference signal generating circuit to the demodulation circuit during control of a characteristic of the demodulation circuit.

16. The demodulator of claim 15, wherein the switch is further for disconnecting the reference signal generating circuit from the demodulation circuit and for connecting the demodulation circuit to receive an input signal, subsequent to control of a characteristic of the demodulation circuit.

17. The demodulator of claim 9, wherein the characteristic of the demodulation circuit is controlled by the control circuit based upon an output value of the demodulation circuit, resulting from the inputted reference signal, being fed back into the control circuit.

18. The demodulator as set forth in claim 9, wherein the frequency characteristic of the demodulation circuit is demodulation sensitivity.

19. The demodulator as set forth in claim 18, wherein the control circuit maintains a state in which control of the frequency characteristic is complete upon the modulated signal being input to the demodulation circuit.

20. The demodulator as set forth in claim 9, wherein the control circuit maintains a state in which control of the frequency characteristic is complete upon the modulated signal being input to the demodulation circuit.

21. A demodulator for demodulating a modulated signal whose frequency is modulated, comprising:

a demodulation circuit having frequency characteristic changeable means for changing a frequency characteristic of an input signal; and a control circuit for controlling a frequency characteristic of the demodulation circuit so that an output of a demodulated signal, obtained when a reference signal used for controlling a characteristic of the demodulation circuit is inputted to the demodulation circuit, becomes a specified value, wherein:

the frequency characteristic changeable means is made up of a circuit which includes a plurality of condensers and switches for switching the respective condensers.

22. A demodulator for demodulating a modulated signal whose frequency is modulated, comprising:

a demodulation circuit having frequency characteristic changeable means for changing a frequency characteristic of an input signal; and a control circuit for controlling a frequency characteristic of the demodulation circuit so that an output of a demodulated signal, obtained when a reference signal used or controlling a characteristic of the demodulation circuit is inputted to the demodulation circuit, becomes a specified value, wherein:

a low pass filter having frequency characteristic changeable means for changing a frequency characteristic of an input signal is provided in a stage subsequent to the demodulation circuit; and a characteristic of the low pass filter is controlled by the control circuit.

23. A communication device provided with a receiving section for receiving a signal, the receiving section including a demodulator comprising:

a complex demodulation circuit for demodulating a complex modulated signal; and a control circuit for controlling a characteristic of the demodulation circuit so that an output value of a demodulated signal, obtained when a reference signal used for controlling the characteristic of the demodulation circuit is inputted to the demodulation circuit, becomes a specified value, wherein both the modulated signal and the demodulated signal are complex signals.

24. The communication device as set forth in claim 23, further comprising a transmitting section which transmits a signal and at least includes a digital-to-analog conversion circuit for converting a digitized transmission signal to an analog signal, wherein:

an signal outputted from the digital-to-analog conversion circuit in the transmitting section is used as the reference signal in the demodulator of the receiving section.

25. The communication device of claim 23, wherein the communication device is a wireless communication device.

26. The communication device of claim 23, further comprising:

a reference signal generating circuit for generating the reference signal; and a switch for connecting the reference signal generating circuit to the demodulation circuit during control of a characteristic of the demodulation circuit.

27. The demodulator of claim 26, wherein the switch is further for disconnecting the reference signal generating circuit from the demodulation circuit and for connecting the demodulation circuit to receive an input signal, subsequent to control of a characteristic of the demodulation circuit.

28. The communication device of claim 23, wherein the characteristic of the demodulation circuit is controlled by the control circuit based upon an output value of the demodulation circuit, resulting from the inputted reference signal, being fed back into the control circuit.

29. The communication device as set forth in claim 23, wherein the characteristic of the demodulation circuit is demodulation sensitivity.

30. The communication device as set forth in claim 29, wherein the control circuit maintains a state in which control of the characteristic is complete upon the modulated signal being input to the demodulation circuit.

31. The communication device as set forth in claim 23, wherein the control circuit maintains a state in which control of the characteristic is complete upon the modulated signal being input to the demodulation circuit.

32. A communication device provided with a receiving section for receiving a signal, the receiving section including a demodulator for demodulating a modulated signal whose frequency is modulated, the demodulator comprising:

a complex demodulation circuit having frequency characteristic changeable means for changing a frequency characteristic of a complex input signal; and a control circuit for controlling a frequency characteristic of the demodulation circuit so that an output value of a demodulated signal, obtained when a reference signal used for controlling a characteristic of the demodulation circuit is inputted to the demodulation circuit, becomes a specified value, wherein both the input signal and the demodulated signal are complex signals.

33. The communication device as set forth in claim 32, further comprising a transmitting section which transmits a signal and at least includes a digital-to-analog conversion circuit for converting a digitized transmission signal to an analog signal, wherein:

an signal outputted from the digital-to-analog conversion circuit in the transmitting section is used as the reference signal in the demodulator of the receiving section.

34. The communication device of claim 32, wherein the communication device is a wireless communication device.

35. The communication device of claim 32, further comprising:

a reference signal generating circuit for generating the reference signal; and a switch for connecting the reference signal generating circuit to the demodulation circuit during control of a characteristic of the demodulation circuit.

36. The demodulator of claim 35, wherein the switch is further for disconnecting the reference signal generating circuit from the demodulation circuit and for connecting the demodulation circuit to receive an input signal, subsequent to control of a characteristic of the demodulation circuit.

37. The communication device of claim 32, wherein the characteristic of the demodulation circuit is controlled by the control circuit based upon an output value of the demodulation circuit, resulting from the inputted reference signal, being fed back into the control circuit.

38. The communication device as set forth in claim 32, wherein the frequency characteristic of the demodulation circuit is demodulation sensitivity.

39. The communication device as set forth in claim 38, wherein the control circuit maintains a state in which control of the frequency characteristic is complete upon the modulated signal being input to the demodulation circuit.

40. The communication device as set forth in claim 32, wherein the control circuit maintains a state in which control of the frequency characteristic is complete upon the modulated signal being input to the demodulation circuit.

41. A method of controlling a characteristic of a complex demodulation circuit, comprising:

inputting a complex reference signal into the complex demodulation circuit;

demodulating the complex reference signal; and controlling a characteristic of the demodulation circuit based upon the demodulated reference signal, wherein both the reference signal and the demodulated reference signal are complex signals.

42. The method of claim 41, further comprising:

demodulating a modulated input signal subsequent to the characteristic of the demodulation circuit being controlled.

43. The method of claim 42, further comprising:

switching between inputting of the reference signal and the modulated signal.

44. The method as set forth in claim 41, wherein the characteristic of the demodulation circuit is demodulation sensitivity.

45. The method as set forth in claim 44, further comprising: maintaining, in a control circuit, a state in which control of the characteristic is complete upon a modulated signal being input to the demodulation circuit.

46. The method as set forth in claim 41, further comprising: maintaining, in a control circuit, a state in which control of the characteristic is complete upon a modulated signal being input to the demodulation circuit.

47. A device for controlling a characteristic of a complex demodulation circuit, comprising:

means for inputting a complex reference signal into the complex demodulation circuit, the complex demodulation circuit demodulating the input complex reference signal; and means for controlling a characteristic of the complex demodulation circuit based upon the demodulated reference signal, wherein both the reference signal and the demodulated reference signal are complex signals.

48. The device of claim 47, wherein the demodulation circuit is adapted to receive and demodulate a modulated input signal, subsequent to the characteristic of the demodulation circuit being controlled.

49. The method of claim 48, further comprising: means for switching between inputting of the reference signal and the modulated signal.

50. The device as set forth in claim 47, wherein the characteristic of the demodulation circuit is demodulation sensitivity.

51. The device as set forth in claim 50, wherein the means for controlling maintains a state in which control of the characteristic is complete upon a modulated signal being input to the demodulation circuit.

52. The device as set forth in claim 47, wherein the means for controlling maintains a state in which control of the characteristic is complete upon a modulated signal being input to the demodulation circuit.

53. A demodulator for demodulating a modulated signal whose frequency is modulated, comprising:

a demodulation circuit having frequency characteristic changeable means for changing a frequency characteristic of an input signal;

a low pass filter having frequency characteristic changeable means for changing a frequency characteristic of a signal output from the demodulation circuit; and a control circuit for controlling a frequency characteristic of the demodulation circuit so that an output of a demodulated signal, obtained when a reference signal used or controlling a characteristic of the demodulation circuit is inputted to the demodulation circuit, becomes a specified value, wherein a characteristic of the low pass filter is controlled by the control circuit.

54. A demodulator for demodulating a modulated signal whose frequency is modulated, comprising:

a demodulation circuit having frequency characteristic changeable means for changing a frequency characteristic of an input signal; and a control circuit for controlling a frequency characteristic of the demodulation circuit so that an output of a demodulated signal, obtained when a reference signal used for controlling a characteristic of the demodulation circuit is inputted to the demodulation circuit, becomes a specified value, wherein the demodulation circuit is provided with a phase shifter which includes a filter circuit as the frequency characteristic changeable means.

55. The demodulator of claim 54, wherein the filter circuit included in the phase shifter and a filter circuit of the band pass filter have the same circuit structure.

* * * * *